United States Patent
Yoo et al.

(10) Patent No.: US 10,020,248 B2
(45) Date of Patent: Jul. 10, 2018

(54) TAPE FOR ELECTRONIC DEVICES WITH REINFORCED LEAD CRACK

(71) Applicant: LG INNOTEK CO., LTD., Seoul (KR)

(72) Inventors: Dae Sung Yoo, Seoul (KR); Han Mo Koo, Seoul (KR); Ki Tae Park, Seoul (KR); Jun Young Lim, Seoul (KR); Tae Ki Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/153,970

(22) Filed: May 13, 2016

(65) Prior Publication Data

US 2016/0254219 A1    Sep. 1, 2016

Related U.S. Application Data

(62) Division of application No. 13/982,658, filed as application No. PCT/KR2011/007580 on Oct. 12, 2011.

(30) Foreign Application Priority Data

Jan. 31, 2011    (KR) .................. 10-2011-0009610

(51) Int. Cl.
*H05K 7/02*    (2006.01)
*H01L 23/498*    (2006.01)
(Continued)

(52) U.S. Cl.
CPC ...... *H01L 23/49811* (2013.01); *H01L 23/315* (2013.01); *H01L 23/4924* (2013.01);
(Continued)

(58) Field of Classification Search
CPC ............ H05K 7/02; H05K 2201/10681; H01L 24/50; H01L 24/86; H01L 2224/0405
See application file for complete search history.

(56) References Cited

U.S. PATENT DOCUMENTS

| 5,198,888 A | 3/1993 | Sugano et al. |
| 5,231,303 A | 7/1993 | Kasahara et al. |

(Continued)

FOREIGN PATENT DOCUMENTS

| JP | H02-69953 A | 3/1990 |
| JP | 09-321083 A | 12/1997 |

(Continued)

OTHER PUBLICATIONS

Office Action dated Jun. 15, 2016 in Chinese Application No. 201180066521.1.

(Continued)

*Primary Examiner* — Nathan Milakovich
(74) *Attorney, Agent, or Firm* — Saliwanchik, Lloyd & Eisenschenk

(57) ABSTRACT

Provided is a tape for electronic devices with lead crack and a method of manufacturing the tape. According to the present invention, by forming a cutting portion on a narrow circuit pattern to be connected from an inner lead to an outer lead and further forming the cutting portion within a resin application portion, the problem of occurrence of cracks along a width of a narrow wiring can be avoided. The tape may include a first lead and a second lead formed on a dielectric substrate and a cutting portion formed on one of the first lead and the second lead wherein the cutting portion is formed within a resin application portion.

10 Claims, 1 Drawing Sheet

(51) Int. Cl.
  *H01L 23/495* (2006.01)
  *H01L 23/31* (2006.01)
  *H01L 23/492* (2006.01)
  *H01L 23/00* (2006.01)

(52) U.S. Cl.
  CPC .. *H01L 23/49572* (2013.01); *H01L 23/49582* (2013.01); *H01L 23/49838* (2013.01); *H01L 23/49894* (2013.01); *H05K 7/02* (2013.01); *H01L 24/50* (2013.01); *H01L 24/86* (2013.01); *H01L 2924/0002* (2013.01)

(56) References Cited

U.S. PATENT DOCUMENTS

| | | | |
|---|---|---|---|
| 5,304,512 A | 4/1994 | Arai et al. | |
| 5,305,130 A * | 4/1994 | Yamawaki | G02F 1/13452 257/734 |
| 5,554,885 A | 9/1996 | Yamasaki et al. | |
| 6,060,770 A | 5/2000 | Nakamura et al. | |
| 6,084,291 A * | 7/2000 | Fujimori | H01L 23/49572 257/666 |
| 6,509,630 B1 | 1/2003 | Yanagisawa | |
| 6,555,755 B1 * | 4/2003 | Yanagisawa | H01L 23/4985 174/254 |
| 6,759,732 B1 | 7/2004 | Imamura | |
| 7,087,987 B2 * | 8/2006 | Chung | H01L 23/4985 257/676 |
| 7,217,990 B2 * | 5/2007 | Chung | H01L 22/32 257/667 |
| 7,687,317 B2 * | 3/2010 | Yanagisawa | H01L 23/4985 257/668 |
| 7,701,722 B2 * | 4/2010 | Hagiwara | H01L 23/4985 174/254 |
| 7,911,050 B2 | 3/2011 | Nakajima | |
| 7,977,578 B2 | 7/2011 | Shin et al. | |
| 8,378,224 B2 * | 2/2013 | Song | H01L 23/49838 174/255 |
| 2007/0034404 A1 | 2/2007 | Shin et al. | |
| 2008/0237815 A1 * | 10/2008 | Yanagisawa | H01L 23/4985 257/668 |
| 2010/0244281 A1 | 9/2010 | Hayashi et al. | |
| 2011/0100687 A1 | 5/2011 | Hong et al. | |
| 2012/0186862 A1 | 7/2012 | Hong et al. | |
| 2013/0186680 A1 * | 7/2013 | Ha | H05K 1/115 174/265 |

FOREIGN PATENT DOCUMENTS

| | | |
|---|---|---|
| JP | H-11288981 A | 10/1999 |
| JP | 11-345839 A | 12/1999 |
| JP | 2001-135676 A | 5/2001 |
| JP | 2006073966 A | 3/2006 |
| JP | 2007-059627 A | 8/2007 |
| KR | 10-2001-0043486 A | 5/2001 |
| KR | 10-0634238 B1 | 10/2006 |
| WO | WO-0054324 A1 | 9/2000 |

OTHER PUBLICATIONS

International Search Report in International Application No. PCT/KR2011/007580, filed Oct. 12, 2011, dated May 2, 2012.
Office Action dated Nov. 11, 2015 in U.S. Appl. No. 13/982,658.

* cited by examiner

TAPE FOR ELECTRONIC DEVICES WITH REINFORCED LEAD CRACK

CROSS-REFERENCE TO RELATED APPLICATIONS

This application is a divisional of U.S. application Ser. No. 13/982,658, filed Jul. 30, 2013, which is the U.S. national stage application of international Patent Application No. PCT/KR2011/007580, filed Oct. 12, 2011, which claims priority to Korean Application No, 10-2011-0009610, filed Jan. 31, 2011, the disclosures of each of which are incorporated herein by reference in their entirety.

TECHNICAL FIELD

Embodiments of the present invention relate to a tape for electronic components with reinforced lead crack and a method of manufacturing the tape.

BACKGROUND

Recently, in a technical field of a semiconductor device, there have been trends of thinning, miniaturizing, high-integrating, high-speed, and multi-pinning. For these objects, a tape carrier film has been widely used, on which wiring patterns are formed on a thin film tape material as a wiring substrate used for mounting semiconductor chips.

A semiconductor chip is mounted on a tape carrier film and packaged, and it refers to as a tape carrier package (TCP). In a case where the tape carrier package is manufactured using a tape carrier film, it is possible to use a technology of tape automated bonding (TAB) when connecting consistently a semiconductor chip and a lead on the tape carrier film, and thus it refers to as a tape.

In a prior tape for electronic components, a wiring pattern connected from an inner lead to an outer lead has a narrow wiring width and thus cracks are formed due to a weak bending property.

DISCLOSURE

Technical Problem

The technical problem to be solved by the present invention relates to provide a tape for electronic devices and a method of manufacturing the tape in which with respect to a connecting configuration, by forming a cutting part (hereinafter, referred to as "cutting portion") on a narrow circuit pattern and forming the cutting portion within a resin application portion, and without being a bending portion, lead crack problem may be solved.

Technical Solution

The technical solutions are solved by forming a cutting portion on a narrow circuit pattern to be connected from a first lead to a second lead and forming the cutting portion within a resin application portion, and without being a bending portion, an occurrence of cracks on a narrow width of wiring can be solved.

In addition, a cutting portion is formed on a circuit pattern to be connected from the first lead to the second lead of a dielectric substrate wherein at least one or more of portions of different intervals between lead patterns are provided.

Advantageous Effects

According to the embodiments of the present invention, by forming a cutting portion on a narrow circuit pattern to be connected from a first lead to a second lead and forming the cutting portion within a resin application portion, and without being a bending portion, the problem of occurrence of cracks along a width of a narrow wiring can be solved.

The technical advantageous effects are not limited thereto and it has to be understood that other effects not set forth in the forgoing are obvious to a person who has ordinary skill in the art.

BRIEF DESCRIPTION OF THE DRAWINGS

The above and other aspects, features and advantages of certain exemplary embodiments of the present invention will be more apparent from the following description taken in conjunction with the accompanying drawings, in which.

REFERENCE NUMERALS

Figure 1:
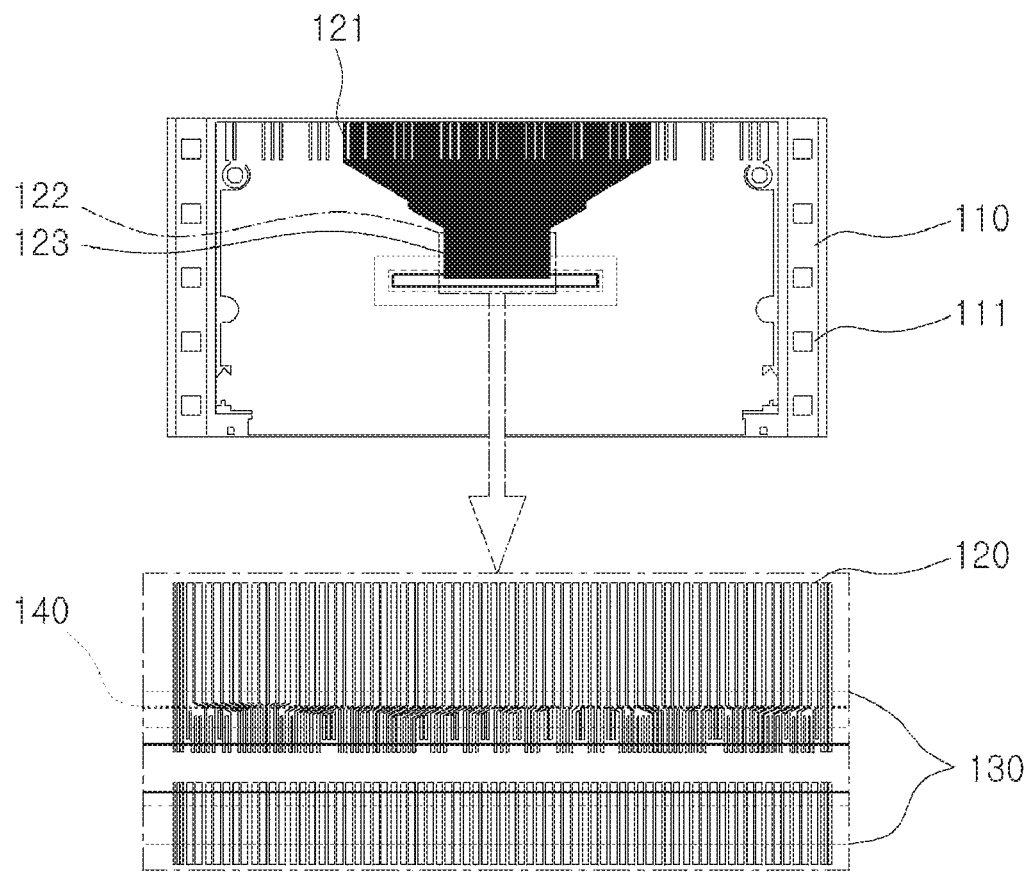
FIG. 1 is a partly exploded plain view of a wiring pattern of a tape according to an embodiment of the present invention.

110: base film
111: sprocket hole
120: wiring pattern
121: first lead
122: second lead
123: connecting portion
130: resin application portion
140: cutting portion (pattern inflection point formation portion)
141: first lead pattern
142: second lead pattern
143: connecting pattern

BEST MODE

Exemplary embodiments of the present invention will be described below in detail with reference to the accompanying drawings. Wherever possible, the same reference numerals will be used to refer to the same elements throughout the specification, and a duplicated description thereof will be omitted. It will be understood that although the terms "first", "second", etc. are used herein to describe various elements, these elements should not be limited by these terms. These terms are only used to distinguish one element from another element.

Figure 2:
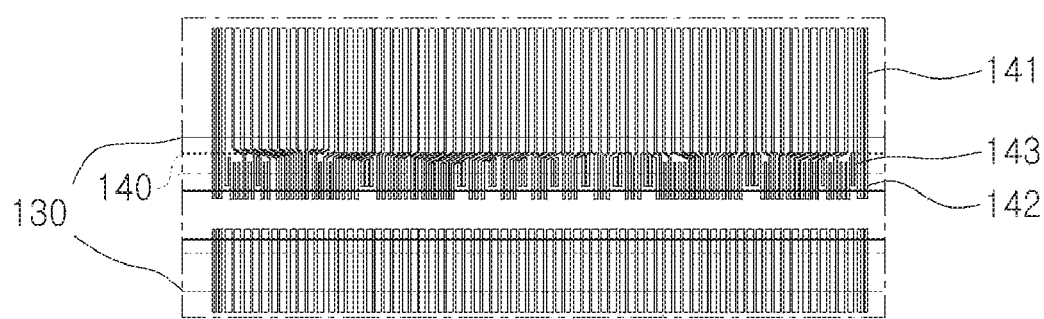
FIG. 2 is a partly exploded plain view of the wiring pattern as shown in FIG. 1.

FIG. 1 is a partly exploded plain view of a wiring pattern of a tape according to an embodiment of the present invention, and FIG. 2 is a partly exploded plain view of the wiring pattern as shown in FIG. 1.

A tape according to the present embodiment of the invention, as shown FIG. 1, may include a first lead 121 and a second lead 122 formed on a dielectric substrate 110, and a cutting portion 140 formed on one of the first lead and the second lead. The cutting portion 140 according to the present invention refers to as a cutting-form connecting pattern (143 in FIG. 2) on a connecting portion of the first lead 121 and the second lead 122. The dielectric substrate 110 may use a base film formed with dielectric material such as polyimide resin.

MODE FOR INVENTION

Furthermore, referring to a partly exploded a wiring pattern 120 as shown in FIG. 1, a tape according to the present embodiment of the invention may include a portion for a chip to be mounted and a resin application portion 130 for burying an electronic device chip. Specially, the cutting portion 140 according to the present invention may be arranged on the resin application portion.

Further, detailed configurations of the tape according to the present embodiment of the invention will be described, referring to FIGS. 1 and 2.

A conductive thin film such as copper foil may be formed on a dielectric substrate 110 and then a wiring pattern may be formed using a photo etching. Here, a plurality of sprocket holes 111 may be formed at a predetermined distance on both edges of the dielectric substrate 110.

Meanwhile, the wiring pattern 120 may include a second lead 122 to be connected electrically to a semiconductor chip using an inner lead bonding (ILB), a first lead 121 for connecting electrically to a terminal outside the substrate, and a connection portion 123 formed as a connecting pattern for connection the first lead 121 and the second lead 122.

Additionally, the second lead 122 is formed to have relatively narrow width in a consideration of being connected to connecting terminals of a fine pitch of a semiconductor chip and the first lead 121 is formed to have a relatively wide width in a consideration of being connected to a terminal outside a substrate, not corresponding directly to fine pitches of a semiconductor chip. The connecting portion 123 may be formed as a cut-form to have a predetermined length for connecting the second lead 122 having a narrow width and the first leads 121 having a wide width.

Here, the second lead 122 may be formed as a wiring pattern to be connected from an inner lead to an outer lead, having a narrow wiring width. Accordingly, in a case where the wiring pattern is formed straightly for connecting directly the first lead and the second lead, as in the prior art, a bending property may be weak and thereby creating cracks.

In order to solve this drawback, in the present embodiment of invention, by forming the cutting portion 140 on a circuit pattern of the second lead 122 to widen a wiring width and by forming the cutting portion 140 within the resin application portion 130, and without being a bending portion, the crack problem may be solved or avoided.

In more detailed description of the circuit pattern of the second lead 122, as shown in FIG. 2, a second lead pattern 142 formed to have relatively narrower width than that of a first lead pattern 141, a first lead pattern 141 formed to have relatively wider width than that of the second lead pattern 142 and a connection pattern 143 for connecting a portion between the first lead pattern 141 and the second lead pattern 142 as a cutting form based on the cutting portion 140 are provided. At this time, the cutting portion 140 may be formed within the resin application portion 130 and without being a bending portion.

By forming the cutting portion in a place where a wiring width is relatively narrower than other places, that is, a circuit pattern of the second lead 122 to be connected from the first lead (for example, inner lead) to the second lead (for example, outer lead), and forming it within the resin application portion after an IC bonding, and designing a lead wiring pattern of two times as an existing lead wiring pattern in a case of an outer part of the resin application portion not to be IC bonded, lead crack can be avoided.

Furthermore, by forming further a plating treatment layer as a single layer or multi layer on a circuit pattern surface of the first lead and the second lead, using one, binary alloy or ternary alloy of Cu, Ni, Pd, Au, Sn, Ag, Co, a circuit pattern can be protected and conductivity of the lead wiring pattern can be improved.

Manufacturing Method of a Tape for Electronic Devices

Referring to FIGS. 1 and 2, a manufacturing method of a tape for electronic devices according to another embodiment of the present invention will be described.

First, a conductive thin film may be formed on one surface of a dielectric substrate 110. At this time, the conductive thin film may be formed as a sputtered-metal layer on a whole surface of the dielectric film. The metal layer may be formed by sputtering one of Cu, Ni, Pd, Au, Sn, Ag, Co. Further, a plating treatment layer may be further formed as a single layer or multi layer using one, binary alloy or e alloy of Cu, Ni, Pd, Au, Sn, Ag, Co.

Next, a wiring pattern may be formed by etching selectively the conductive thin film wherein a cutting portion 140 may be formed on a circuit pattern to be connected from the first lead (inner lead) to the second lead (outer lead), having relatively a narrow wiring width.

Here, the circuit pattern may be separated into the first lead pattern 141 and the second lead pattern 142, based on the cutting portion 140, and may include a connecting pattern for cutting and connecting a portion between the first and second leads 141, 142, based on the cutting portion 140. At this time, a wiring width of the first lead pattern 141 may be wider than that of the second lead pattern 142. The cutting portion 140 may be formed within the resin application portion and without being a bending portion.

According to a tape for electronic devices and a method of the tape of the present invention, by forming a cutting portion on a narrow circuit pattern to be connected from a first lead to a second lead and forming the cutting portion within a resin application portion and without being a bending portion, the technical object of the present invention can be achieved.

The tape according to the present embodiment of the invention may be packaged by applying resin on an electronic device chip to be mounted within the resin application portion 130. The resin to be applied on the resin application portion 130 may be potting material having viscosity, comprising epoxy, epoxy resin, curing material, or inorganic filler.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:
1. A tape for electronic devices comprising:
   a dielectric substrate;
   a resin application portion corresponding to a chip mounting portion formed on the dielectric substrate;
   an electronic device chip mounted on the chip mounting portion, and resin for burying the electronic device chip in the resin application portion;
   a first lead having a plurality of first lead patterns and disposed on the dielectric substrate and connected to a terminal outside the dielectric substrate; and a second lead having a plurality of second lead patterns and disposed on the resin application portion of the dielectric substrate and connected to the electronic device chip;

wherein the second lead includes a cutting portion disposed in the resin application portion, wherein the cutting portion connects the first lead and the second lead in a cutting form;

wherein the cutting portion includes a plurality of connecting patterns connecting the plurality of first lead patterns and the plurality of second lead patterns, respectively;

wherein the plurality of connecting patterns includes a first connecting pattern, a second connecting pattern, and a third connecting pattern;

wherein the first connecting pattern has a first portion having a first angle of inclination with respect to the plurality of first lead patterns and a second portion extended in a longitudinal direction of the plurality of first lead patterns, wherein the second connecting pattern has a third portion having a second angle of inclination with respect to the plurality of first lead patterns and a fourth portion extended in a longitudinal direction of the plurality of first lead patterns, wherein the third connecting pattern is only straightly formed for directly connecting the first lead and the second lead in the longitudinal direction of the plurality of first lead patterns, wherein the first angle of inclination is different from the second angle of inclination, wherein the third connecting pattern is positioned outermost of the plurality of connecting patterns in a direction transverse to the longitudinal direction of the plurality of first lead patterns, wherein each of the plurality of second lead patterns has a width smaller than a width of each of the plurality of first lead patterns, wherein the number of the plurality of first lead patterns is different from the number of the plurality of second lead patterns, wherein the second portion of the first connecting pattern has a plurality of first sub-connecting patterns branching from one first lead pattern of the plurality of first lead patterns, wherein the fourth portion of the second connecting pattern has a plurality of second sub-connecting patterns branching from another first lead pattern of the plurality of first lead patterns, wherein a position of an end of each of the plurality of first sub-connecting patterns is different from each other, and wherein a position of an end of each of the plurality of second sub-connecting patterns is different from each other.

2. The tape for electronic devices of claim 1, wherein a width of the first lead and a width of the second lead are different from each other.

3. The tape for electronic devices of claim 2, wherein a pattern width of the first lead is wider than that of the second lead.

4. The tape for electronic devices of claim 1, wherein the resin comprises a potting material having viscosity.

5. The tape for electronic devices of claim 1, wherein the resin comprises epoxy.

6. The tape for electronic devices of claim 5, wherein the resin further comprises a curing material or an inorganic filler.

7. The tape for electronic devices of claim 1, wherein the dielectric substrate comprises a polyimide film.

8. The tape for electronic devices of claim 1, wherein a plating treatment layer having a material different from those of the first lead and the second lead is disposed on the first lead and the second lead.

9. The tape for electronic devices of claim 8, wherein the plating treatment layer is made of one material selected from the group consisting of Cu, Ni, Pd, Au, Sn, Ag and Co, and binary and ternary alloys thereof.

10. The tape for electronic devices of claim 9, wherein the plating treatment layer has a multi-layer structure.

* * * * *